US012766982B2

(12) United States Patent
Min

(10) Patent No.: US 12,766,982 B2
(45) Date of Patent: Oct. 20, 2026

(54) APPARATUS AND SYSTEM FOR VOLTAGE TESTING OF ELECTRIC RIDE-ON VEHICLE

(71) Applicant: Dynacraft BSC, Inc., Port Wentworth, GA (US)

(72) Inventor: Lv Hui Min, Guangdong (CN)

(73) Assignee: DYNACRAFT BSC, INC., Port Wentworth, GA (US)

( * ) Notice: Subject to any disclaimer, the term of this patent is extended or adjusted under 35 U.S.C. 154(b) by 883 days.

(21) Appl. No.: 18/004,354

(22) PCT Filed: Jul. 10, 2020

(86) PCT No.: PCT/CN2020/101400

§ 371 (c)(1),
(2) Date: Jan. 5, 2023

(87) PCT Pub. No.: WO2022/006870

PCT Pub. Date: Jan. 13, 2022

(65) Prior Publication Data

US 2023/0271514 A1 Aug. 31, 2023

(51) Int. Cl.
*H02J 7/00* (2026.01)
*B60L 53/10* (2019.01)
(Continued)

(52) U.S. Cl.
CPC .............. *B60L 53/11* (2019.02); *G01R 31/40* (2013.01); *H01M 10/4285* (2013.01); *H02J 7/82* (2026.01); *H01M 2220/20* (2013.01)

(58) Field of Classification Search
USPC .......................................................... 320/109
See application file for complete search history.

(56) References Cited

U.S. PATENT DOCUMENTS 5,928,020 A 7/1999 Bishop, Jr. et al.
6,323,621 B1 * 11/2001 Jacobs .................. H01R 31/06 439/502

(Continued)

FOREIGN PATENT DOCUMENTS

CN 101415473 A 4/2009
CN 102215924 A 10/2011

(Continued)

OTHER PUBLICATIONS

International Search Report and Written Opinion for Application No. PCT/CN2020/101400 dated Apr. 1, 2021 (11 pages).

*Primary Examiner* — Samuel Berhanu
(74) *Attorney, Agent, or Firm* — MICHAEL BEST & FRIEDRICH LLP

(57) ABSTRACT

Apparatus and system for testing an electric ride-on vehicle (1). The apparatus includes, in one implementation, a direct current (DC) socket (28), a pair of junction plugs (30A, 30B), and a control circuit (32). The DC socket (28) is configured to receive a DC plug of a wall charger (14). The pair of junction plugs (30A, 30B) is configured to receive a connector of a battery (12) and a connector of a charging circuit (16). The control circuit (32) is electrically coupled to the DC socket (28) and the pair of junction plugs (30A, 30B). The control circuit (32) is configured to test voltages of the battery (12), the wall charger (14), and the charging circuit (16).

14 Claims, 3 Drawing Sheets

(51) Int. Cl.

| | |
|---|---|
| ***G01R 31/40*** | (2020.01) |
| ***H01M 10/42*** | (2006.01) |
| ***H02J 7/82*** | (2026.01) |

(56) References Cited

U.S. PATENT DOCUMENTS

| | | | | |
|---|---|---|---|---|
| 6,784,668 | B1 * | 8/2004 | Lambert | G11C 29/02 365/225.7 |
| 7,285,959 | B1 * | 10/2007 | Collins | H01M 10/482 324/426 |
| 2006/0113956 | A1 * | 6/2006 | Bublitz | H02J 7/0044 320/112 |
| 2006/0192506 | A1 | 8/2006 | Miffit et al. | |
| 2013/0328515 | A1 | 12/2013 | Kopiness | |
| 2016/0327601 | A1 * | 11/2016 | Brockman | G01R 31/67 |

FOREIGN PATENT DOCUMENTS

| | | | |
|---|---|---|---|
| CN | 102598461 | A | 7/2012 |
| CN | 104617348 | A | 5/2015 |

* cited by examiner

APPARATUS AND SYSTEM FOR VOLTAGE TESTING OF ELECTRIC RIDE-ON VEHICLE

FIELD

The present disclosure relates generally to apparatuses and systems for testing voltages of electric ride-on vehicles. More specifically, the present disclosure relates to apparatuses and systems for testing voltage of batteries, wall chargers, and charging circuits of electric ride-on vehicles.

BACKGROUND

Nowadays, parents often chose electric ride-on vehicles as a necessary toy for their children. When the battery of an electric ride-on vehicle runs out, the battery must be recharged for next time use and to protect the battery to extend its life. Most users, however, forget to recharge the battery after the electric ride-on vehicle is used. In addition, the battery may drain out over an extended period of disuse. A battery is unable to provide sufficient power to an electric ride-on vehicle when the battery is in a low voltage condition. Thus, it is helpful to check the condition of the battery before reusing the electric ride-on vehicle. Some current wall chargers for batteries have a built-in indicator that shows when a battery is fully-charged. However, these wall chargers often provide erroneous readings. Further, when a fault occurs, these wall chargers are unable to identify the cause of the fault. For example, the battery could be faulty, the wall charger itself could be faulty, or the charging circuit within the electric ride-on vehicle could be faulty. Currently, users are unable to check and identify different types of electrical faults in electric ride-on vehicles without the use of special tools. The current inability to easily check and identify different types of electrical faults makes providing after-sale service very difficult.

SUMMARY

In order to address the issues described above, the present disclosure provides, among other things, apparatuses and systems for testing batteries, wall chargers, and charging circuits of electric ride-on vehicles in a simple, fast, and safe manner. For example, the apparatuses and systems described herein allow a user to check a battery, a wall charger and a charging circuit of an electric ride-on vehicle separately, and directly read out the testing results with colors of lighting elements (for example, light-emitting diodes).

The present disclosure provides an apparatus for testing an electric ride-on vehicle. The apparatus includes, in implementation, a direct current (DC) socket, a pair of junction plugs, and a control circuit. The DC socket is configured to receive a DC plug of a wall charger. The pair of junction plugs are configured to receive a connector of a battery and a connector of a charging circuit. The control circuit is electrically coupled to the DC socket and the pair of junction plugs. The control circuit is configured to test voltages of the battery, the wall charger, and the charging circuit.

The present disclosure also provides a system for testing an electric ride-on vehicle. The system includes, in one implementation, a battery, a wall charger, a charging circuit, and a testing device. The testing device includes, in one implementation, a DC socket, a pair of junction plugs, and a control circuit. The DC socket is configured to receive a DC plug of the wall charger. The pair of junction plugs are configured to receive a connector of the battery and a connector of the charging circuit. The control circuit is electrically coupled to the DC socket and the pair of junction plugs. The control circuit is configured to test voltages of the battery, the wall charger, and the charging circuit.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate implementations, and explain various principles and advantages of those implementations.

Figure 1:
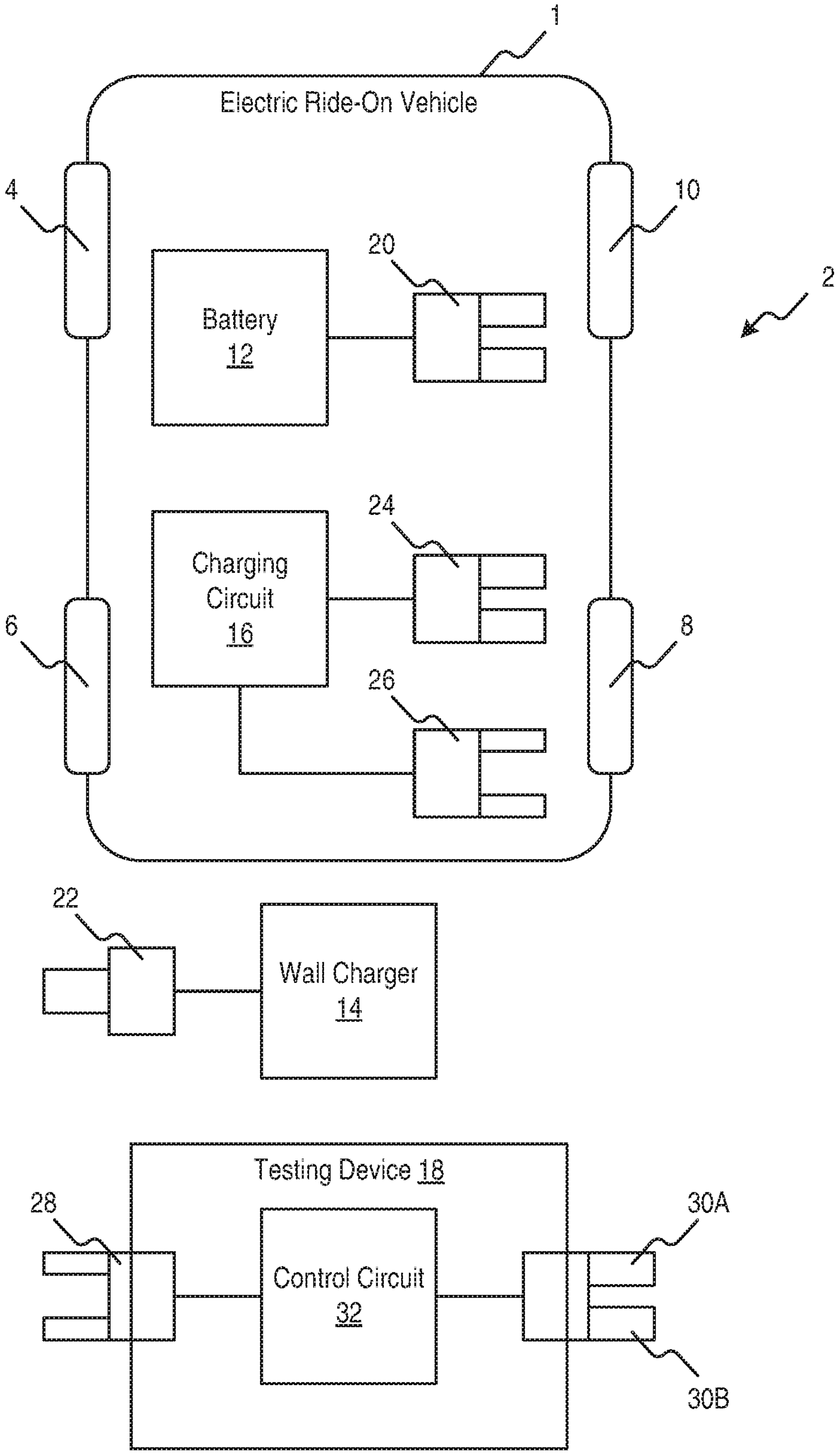
FIG. 1 is a block diagram of one example an electric ride-on vehicle equipped with a system fir voltage testing, in accordance with some implementations.

The apparatus and system components have been represented where appropriate by conventional symbols in the drawings, showing only those specific details that are pertinent to understanding the implementations so as not to obscure the present disclosure with details that will be readily apparent to those of ordinary skill in the art having the benefit of the description herein.

DETAILED DESCRIPTION

FIG. 1 is a block diagram of one example of an electric ride-on vehicle 1 equipped with a system 2 for voltage testing. The electric ride-on vehicle 1 illustrated in FIG. 1 is a vehicle that includes four wheels 4, 6, 8, and 10. In some implementations, the system 2 is equipped to an electric ride-on vehicle with more or less than four wheels. For example, the system 2 may be equipped to a motorcycle, a scooter, and the like. In practice, the electric ride-on vehicle 1 includes additional components such as a propulsion system, a steering system, and the like. For ease of explanation, these additional components are not illustrated here.

The system 2 illustrated in FIG. 1 includes a battery 12, a wall charger 14, a charging circuit 16, and a testing device 18. In some implementations, the system 2 includes fewer or additional components in configurations different from the one illustrated in FIG. 1. For example, in practice, the system 2 may include additional components such as driving systems and the like. For ease of explanation, these additional components are not illustrated here. In some implementations, the system 2 is wholly or partially contained within the electric ride-on vehicle 1.

The battery 12 supplies power to operate circuits and components within the electric ride-on vehicle 1 (for example, motors, lights, and speakers, and the like). The battery 12 supplies a direct current (DC) voltage between, for example, 6 Volts and 12 Volts. The battery 12 includes, for example, a sealed lead acid (SLA) batteries, absorbent glass mat (AGM) batteries, a lithium-ion battery, and the like. The battery 12 includes a connector 20 for electrically coupling the battery 12 to, for example, the charging circuit 16.

The wall charger 14 supplies power for recharging the battery 12. The wall charger 14 is powered by mains power having line voltages between, for example, 120 volts and 240 volts alternating current (AC) and frequencies between, for example, 50 Hertz and 60 Hertz. The wall charger 14 is configured to convert the AC voltage of the mains power to a DC voltage between, for example, 6 Volts and 12 Volts. The wall charger 14 includes a DC plug 22 for coupling the wall charger 14 to, for example, the charging circuit 16.

The wall charger 14 cannot be coupled with the battery 12 directly. The charging circuit 16 acts as a bridge between the wall charger 14 and the battery 12. The charging circuit 16 includes a connector 24 for coupling the charging circuit 16 to the battery 12. For example, the connector 24 of the charging circuit 16 is configured to couple with the connector 20 of the battery 12. The charging circuit 16 also includes a DC socket 26 for coupling the charging circuit 16 to the wall charger 14. For example, the DC socket 26 of the charging circuit 16 is configured to couple with the DC plug 22 of the wall charger 14.

The testing device 18 illustrated in FIG. 1 includes a DC socket 28, a pair of junction plugs 30A and 30B, and a control circuit 32. The DC socket 28 of the testing device 18 is configured to couple with the DC plug 22 of the wall charger 14. The pair of junction plugs 30A and 30B are configured to couple with the connector 24 of the charging circuit 16 and with the connector 20 of the battery 12. The control circuit 32 is electrically coupled to the DC socket 28 and the pair of junction plugs 30A and 30B. The control circuit 32 is configured to test voltages of the battery 12, the wall charger 14, and the charging circuit 16. For example, the control circuit 32 is configured to test the voltage of the battery 12 when the pair of junction plugs 30A and 30B are coupled to the connector 20 of the battery 12. Further, the control circuit 32 is configured to test the voltage of the wall charger 14 when the DC socket 28 is coupled to the DC plug 22 of the wall charger 14. In addition, the control circuit 32 is configured to test the voltage of the charging circuit 16 when the pair of junction plugs 30A and 30B are coupled to the connector 24 of the charging circuit 16 and the DC socket 28 is coupled to the DC plug 22 of the wall charger 14. In this manner, when a fault occurs, the testing device 18 enables a user to easily discern whether the battery 12 is faulty, the wall charger 14 is faulty, and/or the charging circuit 16 is faulty.

Figure 2:
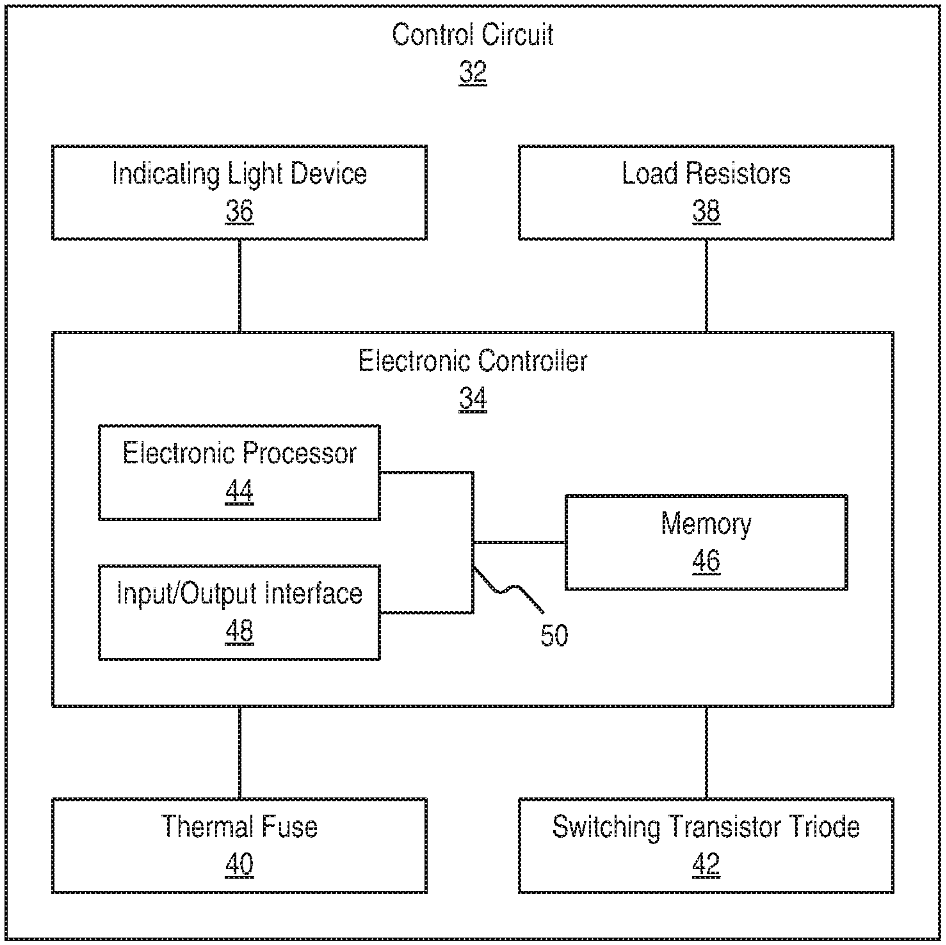
FIG. 2 is a block diagram of one example of a control circuit included in the system illustrated in FIG. 1, in accordance with some implementations.

FIG. 2 is a block diagram of one example of the control circuit 32 included in the testing device 18. The control circuit 32 illustrated in FIG. 2 includes an electronic controller 34, an indicating light device 36, a plurality of load resistors 38, a thermal fuse 40, and a switching transistor triode 42. In some implementations, all or any combination of the components of the control circuit 32 are included on one or more printed circuit boards (PCBs). The electronic controller 34 illustrated in FIG. 2 includes an electronic processor 44 (for example, one or more microprocessors, application-specific integrated circuits (ASICs), systems-on-a-chip (SoCs), or other electronic controllers), memory 46, and an input/output interface 48. The components included in the electronic controller 34 are coupled to each other via a bus 50. The memory 46 includes, for example, read-only -memory (ROM), random access memory (RAM), an electrically erasable programmable read-only memory (EEPROM), other non-transitory computer-readable media, or a combination thereof. In some implementations, the memory 46 is included in the electronic processor 44. The electronic processor 44 is configured to retrieve computer-readable instructions and data from the memory 46 and execute the computer-readable instructions to perform the functionality and methods described herein. The input/output interface 48 includes routines for transferring data between components within the electronic controller 34 and components external to the electronic controller 34. The input/output interface 48 is configured to transmit and receive data via one or more wired couplings (for example, wires, optical fiber, and the like), wirelessly, or a combination thereof.

The indicating light device 36 illuminates to indicate statuses of the battery 12, the wall charger 14, and the charging circuit 16. For example, the electronic controller 34 is configured to send signals to the indicating light device 36 to indicate the status of the battery 12. In some implementations, the indicating light device 36 includes two or more lighting elements (for example, two light-emitting diodes [LEDs] that each, emit different colors of lights). For example, the indicating light device 36 may include a red LED and a green LED. The green LED may be illuminated to indicate a good status and the red LED may be illuminated to indicated to indicate a bad status. For example, the green LED illuminates when the battery 12 is functioning properly and the red LED illuminates to indicate a fault in the battery 12. In some implementations, either the green LED or the red LED illuminate to indicate a good status and neither LED illuminates to indicate a bad status. For example, the green LED or the red LED illuminates When the wall charger 14 is functioning properly and neither LED illuminates to indicate a fault in the wall charger 14.

The plurality of load resistors 38 are configured to test load capacities of the battery 12 and the wall charger 14. The thermal fuse 40 and the switching transistor triode 42 provide rectifying and regulating functionality for the control circuit 32. For example, the thermal fuse 40 is configured to protect the safety of the testing device 18 when the testing device 18 is electrified.

Figure 3:
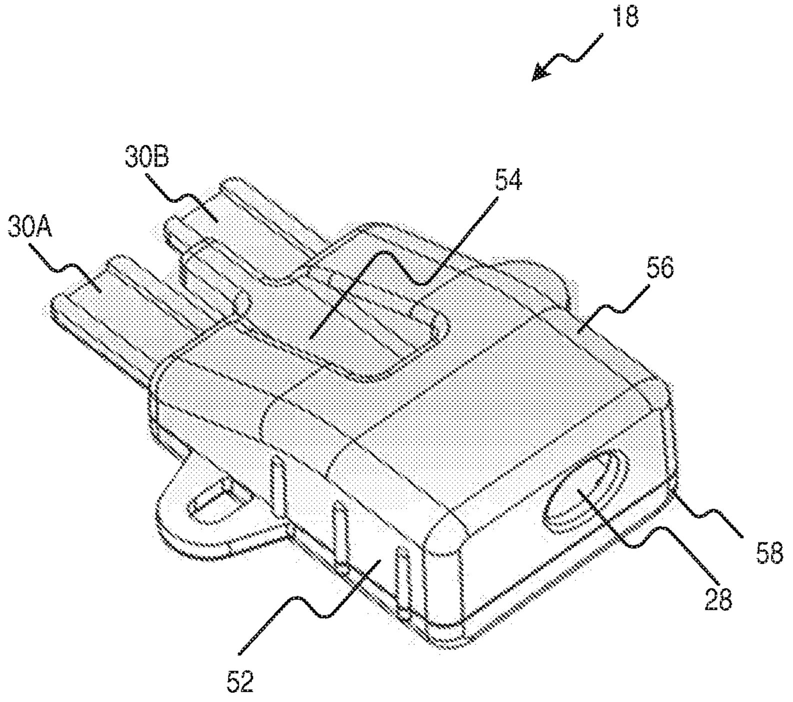
FIG. 3 is an external view of a testing device included in the system illustrated in FIG. 1, in accordance with some implementations.

FIG. 3 is an external view of one example of the testing device 18. The testing device 18 illustrated in FIG. 3 includes a housing 52 (for example, a body case composed of plastic). In some implementations, the indicating light device 36 is positioned within the housing 52 and the housing 52 includes a viewing point 54 such that the illumination of the indicating light device 36 is visible outside the housing 52. In some implementations, the viewing point 54 is a translucent area on a surface of the housing 52. For example, the viewing point 54 may be a translucent area positioned above the indicating light device 36 as illustrated in FIG. 3. In some implementations, the housing 52 includes a first shell 56 and a second shell 58 that are connected to each other as illustrated in FIG. 3. In FIG. 3, the viewing point 54 is positioned on a surface of the first shell 56. Also, in FIG. 3, the pair of junction plugs 30A and 30B protrude outside of the housing 52.

Various aspects of the disclosure may take any one or more of the following exemplary configurations (EC).

EC(1) An apparatus for testing an electric ride-on vehicle, the apparatus comprising: a direct current (DC) socket configured to receive a DC socket of a wall charger; a pair of junction plugs configured to receive a connector of a battery and a connector of a charging circuit; and a control circuit electrically coupled to the DC socket and the pair of junction plugs, the control circuit configured to test voltages of the battery, the wall charger, and the charging circuit.

EC(2) The apparatus of EC(1), further comprising an indicating light device, wherein the control circuit is further configured to illuminate the indicating light device to indicate statuses of the battery, the wall charger, and the charging circuit.

EC(3) The apparatus of EC(2), wherein the indicating light device includes at least two light-emitting diodes (LEDs).

EC(4) The apparatus of any one of EC(1) to EC(3), further comprising a housing including a viewing point, wherein the viewing point is positioned adjacent to the indicating light device such that the indicating light device is visible from outside the housing.

EC(5) The apparatus of EC(4), wherein the viewing point is positioned above the indicating light device.

EC(6) The apparatus of EC(4) or EC(5), wherein the viewing point is a translucent window on a surface of the housing.

EC(7) The apparatus of any one of EC(1) to EC(6), wherein the control circuit is further configured to: test the voltage of the battery when the pair of junction plugs are coupled to the connector of the battery, test the voltage of the wall charger when the DC socket of the apparatus is coupled to the DC plug of the wall charger, and test the voltage of the charging circuit when the pair of junction plugs are coupled to the connector of the charging circuit and the DC plug of the wall charger is coupled to a DC socket of the charging circuit.

EC(8) The apparatus of any one of EC(1) to EC(7), wherein the control circuit includes a plurality of load resistors for testing load capacities of the batter and the wall charger.

EC(9) The apparatus of any one of EC(1) to EC(8), wherein the control circuit includes a thermal fuse.

EC(10) The apparatus of any one of EC(1) to EC(9), wherein the control circuit includes a switching transistor triode.

EC(11) A system for testing an electric ride-on vehicle, the system comprising: a battery; a wall charger; a charging circuit; and a testing device including: a direct current (DC) socket configured to receive a DC plug of the wall charger, a pair of junction plugs configured to receive a connector of the battery and a connector of the charging circuit, and a control circuit electrically coupled to the DC socket and the pair of junction plugs, the control circuit configured to test voltages of the battery, the wall charger, and the charging circuit.

EC(12) The system of EC(11), wherein the testing device further includes an indicating light device, wherein the control circuit is further configured to illuminate the indicating light device to indicate statuses of the battery, the wall charger, and the charging circuit.

EC(13) The system of EC(12), wherein the indicating light device having a first light-emitting diode (LED) configured to emit a first color of light, and a second LED configured to emit a second color of light, and wherein the control circuit is further configured to illuminate the first LED to indicate a good status and illuminate the second LED to indicate a bad status.

EC(14) The system of EC(12) or EC(13), wherein the testing device further includes a housing, wherein the housing having a first shell and a second shell, wherein the first shell having a translucent area on a surface of the first shell, and wherein the translucent area positioned above the indicating light device.

EC(15) The system of any one of EC(11) to EC(14), wherein the control circuit is further configured to: test the voltage of the battery when the pair of junction plugs are coupled to the connector of the battery, test the voltage of the wall charger when the DC socket of the testing device is coupled to the DC plug of the wall charger, and test the voltage of the charging circuit when the pair of junction plugs are coupled to the connector of the charging circuit and the DC plug of the wall charger is coupled to a DC socket of the charging circuit.

EC(16) The system of any one of EC(11) to EC(15), wherein the control circuit including an electronic controller, a plurality of load resistors, a thermal fuse, and a switching transistor triode.

Thus, the present disclosure provides, among other things, apparatuses and systems for testing voltage of electric ride-on vehicles. Various features and advantages are set forth in the following claims.

In the foregoing specification, specific implementations have been described. However, one of ordinary skill in the an appreciates that various modifications and changes may be made without departing from the scope of the claims set forth below. Accordingly, the specification and figures are to be regarded in an illustrative rather than a restrictive sense, and all such modifications are intended to be included within the scope of the disclosure.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not it only those elements but may include other elements not expressly listed or inherent to such process, method, article, or apparatus. An element proceeded by "comprises . . . a," "has . . . a," "includes . . . a,"or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An apparatus for testing an electric ride-on vehicle, the apparatus comprising:

a direct current (DC) socket configured to receive a DC plug of a wall charger;

a pair of junction plugs configured to receive a connector of a battery and a connector of a charging circuit; and a control circuit electrically coupled to the DC socket and the pair of junction plugs, the control circuit configured to individually test a voltage of each of the battery, the wall charger, and the charging circuit by testing the voltage of the battery when the pair of junction plugs are coupled to the connector of the battery, testing the voltage of the wall charger when the DC socket of the apparatus is coupled to the DC plug of the wall charger, and testing the voltage of the charging circuit when the pair of junction plugs are coupled to the connector of the charging circuit and the DC plug of the wall charger is coupled to a DC socket of the charging circuit, wherein the control circuit is configured to indicate a status of at least one of the battery, the wall charger, and the charging circuit based on the testing of the voltage of the battery, the testing of the voltage of the wall charger, and the testing of the voltage of the charging circuit.

2. The apparatus of claim 1, further comprising an indicating light device, wherein the control circuit is further configured to illuminate the indicating light device to indicate statuses of the battery, the wall charger, and the charging circuit.

3. The apparatus of claim 2, wherein the indicating light device includes at least two light-emitting diodes (LEDs).

4. The apparatus of claim 2, further comprising a housing including a viewing point, wherein the viewing point is positioned adjacent to the indicating light device such that the indicating light device is visible from outside the housing.

5. The apparatus of claim 4, wherein the viewing point is positioned above the indicating light device.

6. The apparatus of claim 4, wherein the viewing point is a translucent window on a surface of the housing.

7. The apparatus of claim 1, wherein the control circuit includes a plurality of load resistors for testing load capacities of the battery and the wall charger.

8. The apparatus of claim 1, wherein the control circuit includes a thermal fuse.

9. The apparatus of claim 1, wherein the control circuit includes a switching transistor triode.

10. A system for testing an electric ride-on vehicle, the system comprising:

a battery;

a wall charger;

a charging circuit; and a testing device including:

a direct current (DC) socket configured to receive a DC plug of the wall charger, a pair of junction plugs configured to receive a connector of the battery and a connector of the charging circuit, and a control circuit electrically coupled to the DC socket and the pair of junction plugs, the control circuit configured to individually test a voltage of each of the battery, the wall charger, and the charging circuit, by testing the voltage of the battery when the pair of junction plugs are coupled to the connector of the battery, testing the voltage of the wall charger when the DC socket of the apparatus is coupled to the DC plug of the wall charger, and testing the voltage of the charging circuit when the pair of junction plugs are coupled to the connector of the charging circuit and the DC plug of the wall charger is coupled to a DC socket of the charging circuit, wherein the control circuit is configured to indicate a status of at least one of the battery, the wall charger, and the charging circuit based on the testing of the voltage of the battery, the testing of the voltage of the wall charger, and the testing of the voltage of the charging circuit.

11. The system of claim 10, wherein the testing device further includes an indicating light device, wherein the control circuit is further configured to illuminate the indicating light device to indicate statuses of the battery, the wall charger, and the charging circuit.

12. The system of claim 11, wherein the indicating light device having a first light-emitting diode (LED) configured to emit a first color of light, and a second LED configured to emit a second color of light, and wherein the control circuit is further configured to illuminate the first LED to indicate a good status and illuminate the second LED to indicate a bad status.

13. The system of claim 11, wherein the testing device further includes a housing, wherein the housing having a first shell and a second shell, wherein the first shell having a translucent area on a surface of the first shell, and wherein the translucent area positioned above the indicating light device.

14. The system of claim 10, wherein the control circuit including an electronic controller, a plurality of load resistors, a thermal fuse, and a switching transistor triode.

* * * * *